United States Patent
Matsuda et al.

(10) Patent No.: US 8,142,678 B2
(45) Date of Patent: Mar. 27, 2012

(54) PEROVSKITE TYPE OXIDE MATERIAL, PIEZOELECTRIC ELEMENT, LIQUID DISCHARGE HEAD AND LIQUID DISCHARGE APPARATUS USING THE SAME, AND METHOD OF PRODUCING PEROVSKITE TYPE OXIDE MATERIAL

(75) Inventors: Takanori Matsuda, Chofu (JP);
Katsumi Aoki, Yokohama (JP);
Toshihiro Ifuku, Yokohama (JP);
Kenichi Takeda, Yokohama (JP);
Tetsuro Fukui, Yokohama (JP); Hiroshi Funakubo, Yokohama (JP); Shintaro Yokoyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 678 days.

(21) Appl. No.: 11/499,722

(22) Filed: Aug. 7, 2006

(65) Prior Publication Data
US 2007/0060467 A1   Mar. 15, 2007

(30) Foreign Application Priority Data

Aug. 23, 2005 (JP) .................... 2005-241385
Aug. 23, 2005 (JP) .................... 2005-241431

(51) Int. Cl.
*C04B 35/00* (2006.01)
(52) U.S. Cl. ............. 252/62.9 PZ; 501/134; 501/135; 501/136; 117/947; 117/948; 117/949
(58) Field of Classification Search .......... 501/134, 501/135, 136; 252/62.9 R, 62.9 Z, 62.9 PZ; 117/947–949
See application file for complete search history.

(56) References Cited

U.S. PATENT DOCUMENTS

| | | | |
|---|---|---|---|
| 5,081,474 A | | 1/1992 | Shibata et al. |
| 5,192,723 A | * | 3/1993 | Fujiu et al. ............ 501/136 |
| 5,491,505 A | | 2/1996 | Suzuki et al. |
| 5,914,507 A | * | 6/1999 | Polla et al. ............ 257/254 |
| 6,093,338 A | * | 7/2000 | Tani et al. ............ 252/62.9 R |
| 6,231,779 B1 | * | 5/2001 | Chiang et al. ........ 252/62.9 R |
| 6,653,211 B2 | | 11/2003 | Unno et al. |
| 6,793,843 B2 | | 9/2004 | Furukawa et al. |
| 6,854,832 B2 | | 2/2005 | Matsuda |
| 6,927,084 B2 | | 8/2005 | Fukui et al. |
| 7,045,935 B2 | | 5/2006 | Matsuda et al. |
| 7,053,526 B2 | | 5/2006 | Unno et al. |

(Continued)

FOREIGN PATENT DOCUMENTS

JP           7-017713           1/1995
(Continued)

OTHER PUBLICATIONS

U.S. Appl. No. 11/464,116, Katsumi Aoki, Toshihiro Ifuku, Takanori Matsuda, filed Aug. 11, 2006, Pending.

(Continued)

*Primary Examiner* — David M. Brunsman
*Assistant Examiner* — Kevin Johnson
(74) *Attorney, Agent, or Firm* — Fitzpatrick, Cella, Harper & Scinto

(57) ABSTRACT

A perovskite type oxide of a single crystal structure or a uniaxial-oriented crystal structure is represented by $ABO_3$. Site A includes Pb as a main component and site B includes a plurality of elements. The perovskite type oxide includes a plurality of crystal phases selected from the group consisting of tetragonal, rhombohedral, orthorhombic, cubic, pseudo-cubic and monoclinic systems and the plurality of crystal phases are oriented in the direction of <100>.

11 Claims, 10 Drawing Sheets

U.S. PATENT DOCUMENTS

| | | |
|---|---|---|
| 7,059,711 B2 | 6/2006 | Aoto et al. |
| 7,120,978 B2 | 10/2006 | Wasa et al. |
| 7,144,101 B2 | 12/2006 | Ifuku et al. |
| 2004/0155559 A1 | 8/2004 | Ifuku et al. |
| 2005/0122005 A1 | 6/2005 | Higuchi et al. |
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0033780 A1 | 2/2006 | Ono et al. |
| 2006/0033782 A1 | 2/2006 | Sakai et al. |
| 2006/0046319 A1 | 3/2006 | Takeda |
| 2006/0049135 A1 | 3/2006 | Okabe et al. |
| 2006/0146095 A1 | 7/2006 | Sakai et al. |
| 2006/0170734 A1 | 8/2006 | Ibe et al. |
| 2007/0046152 A1 | 3/2007 | Ifuku et al. |
| 2007/0046153 A1 | 3/2007 | Matsuda et al. |
| 2007/0046154 A1 | 3/2007 | Ifuku et al. |
| 2007/0046734 A1 | 3/2007 | Aoki et al. |
| 2007/0048190 A1 | 3/2007 | Ifuku et al. |

FOREIGN PATENT DOCUMENTS

| | | |
|---|---|---|
| JP | 2003-270602 | 9/2003 |

OTHER PUBLICATIONS

U.S. Appl. No. 11/564,643, Katsumi Aoki, Kenichi Takeda, Toshihiro Ifuku, Takanori Matsuda, Hiroshi Funakubo, Shintaro Yokoyama, Satoshi Okamoto, filed Nov. 29, 2006, Pending.

U.S. Appl. No. 11/677,267, Toshihiro Ifuku, Katsumi Aoki, Takanori Matsuda, Hiroshi Funakubo, Shintaro Yokoyama, Yong Kwan Kim, Hiroshi Nakaki, Rikyu Ikariyama, filed Feb. 21, 2007, Pending.

U.S. Appl. No. 11/683,100, Tetsuro Fukui, Kenichi Takeda, Katsumi Aoki, Toshihiro Ifuku, Takanori Funakubo, Shintaro Yokoyama, Takashi Katoda, Ken Nishida, filed Mar. 7, 2007, Pending.

* cited by examiner

PEROVSKITE TYPE OXIDE MATERIAL, PIEZOELECTRIC ELEMENT, LIQUID DISCHARGE HEAD AND LIQUID DISCHARGE APPARATUS USING THE SAME, AND METHOD OF PRODUCING PEROVSKITE TYPE OXIDE MATERIAL

BACKGROUND OF THE INVENTION

1. Field of the Invention

The present invention relates to a perovskite type oxide material that can be used as a piezoelectric member, a piezoelectric element, a liquid discharge head and liquid discharge apparatus using the same, and a method of producing the perovskite type oxide material.

2. Description of the Related Art

A piezoelectric member has piezoelectric characteristics, that is, converting electric energy into mechanical energy, namely, converting electric energy into mechanical displacement, stress or vibration, and vice versa. A conventional piezoelectric element is formed by sandwiching a thin film of such a piezoelectric member between electrodes. When an electric field is applied to the piezoelectric member, the member causes displacement. In contrast, when the electric field is removed from the member, the state of displacement returns to the original state. A piezoelectric element uses such piezoelectric characteristics of the piezoelectric member and can be used in a motor, ultrasonic motor, transducer and actuator all requiring reciprocal movement. In addition, a piezoelectric element is frequently used in inkjet printers, communications, biotechnology, medical care and sensors such as an automobile acceleration sensor and a pressure sensor for measurement. With the advance of recent technology in the micro electromechanical system (MEMS), a piezoelectric element more reduced in size and more excellent in piezoelectric characteristics has been desired.

As a material for a piezoelectric member used in such a piezoelectric element, mention may be made of a PZT based material, which was found about 50 years ago. In an attempt to form a thin film of the PZT based material, which has a sintering temperature of 1100° C. or more, a sol-gel method, sputtering method, MBE method, PLD method and CVD method have been developed. However, the thin-film piezoelectric element formed of a PZT based material prepared by any one of the aforementioned methods has a problem in that a physical decomposition is likely to occur within the film or the film-interface. In particular, to obtain a high definition device reduced in size in the field of the MEMS, it has been desired to develop a material for a piezoelectric member further improved in piezoelectric characteristics and improved in uniformity of piezoelectric characteristics by suppressing variance in piezoelectric characteristics caused by miniaturization processing.

On the other hand, a ceramic material such as $BaTiO_3$ and $Pb(Zr, Ti)O_3$ has been used as a material for a condenser, since it has a high relative dielectric constant. To satisfy the requirement for reducing the size of a condenser, a ceramic material formed into a thin film has been desired. Unfortunately, when these ceramic materials, which have relative dielectric constants of about 1500, are processed into thin films, sintering failure and a defective structure at the film interface may occur. The resultant condenser formed of such a ceramic material may not be free from defective characteristics.

There are many reports on a piezoelectric material having improved piezoelectric characteristics and a method of producing such a material.

The specification of U.S. Pat. No. 6,793,843 discloses a piezoelectric electromagnetic device containing a rhombohedral perovskite structure compound, a tetragonal perovskite structure compound, and an orthorhombic perovskite structure compound.

Japanese Patent Application Laid-Open No. 2003-270602 discloses a single crystal perovskite oxide represented by $ABO_3$, where the main component of reference symbol A is Pb and the main component of reference symbol B consists of at least three types of elements selected from the group consisting of Zn, Nb and Ti.

U.S. Patent Publication 2005-122005A1 discloses a method of forming a thin film of a perovskite type oxide using a single crystal material as a substrate.

However, the piezoelectric electromagnetic device disclosed in the specification of U.S. Pat. No. 6,793,843 has a problem. Since a mixture of perovskite structure compounds having different crystal systems is used, the piezoelectric characteristics of the device are improved but varied in sites. Obtaining a thin film having sufficiently uniform piezoelectric characteristics has remained unsolved.

On the other hand, a good ceramic material as disclosed in Japanese Patent Application Laid-Open No. 2003-270602 is not yet widely known. When a perovskite type oxide is formed into a thin film, it is very difficult to employ a sputtering method using a ceramic of a perovskite type oxide as a target.

U.S. Patent Publication No. 2005-122005A1 discloses an ion beam assist method. However, it is difficult to produce a perovskite type oxide having a large-area single crystal by this method. Furthermore, the method involves a high cost.

SUMMARY OF THE INVENTION

The present invention is directed to obtaining a highly uniform perovskite type oxide, and more particularly, to obtaining a perovskite type oxide having excellent piezoelectric characteristics, having strength even if it is a thin film, high adhesiveness, and excellent durability, and also directed to forming the perovskite type oxide having a large area in a simple step.

According to the present invention, there is provided a perovskite type oxide of a single crystal structure or a uniaxial-oriented crystal structure represented by $ABO_3$ where site A includes Pb as a main component and site B includes a plurality of elements.

The perovskite type oxide is characterized by including a plurality of crystal phases selected from the group consisting of tetragonal, rhombohedral, orthorhombic, cubic, pseudo-cubic and monoclinic systems and that the plurality of crystal phases are oriented in the direction of <100>. The present invention is also directed to a method of producing the perovskite type oxide, a piezoelectric element of the perovskite type oxide, a liquid discharge head, and a liquid discharge apparatus.

Further features of the present invention will become apparent from the following description of exemplary embodiments (with reference to the attached drawings).

DESCRIPTION OF THE EMBODIMENTS

Figure 1:
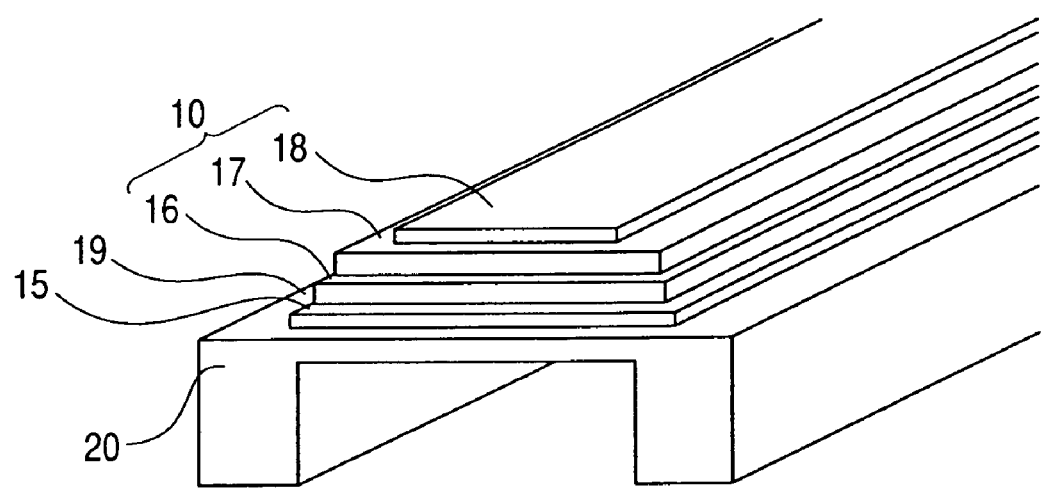
FIG. 1 is a perspective view partly showing a piezoelectric element applicable to the present invention.

According to the present invention, it is possible to obtain a perovskite type oxide excellent in uniformity. As a result, the perovskite type oxide has excellent piezoelectric characteristics and has strength even if it is a thin film, and has high adhesiveness and excellent durability.

A perovskite type oxide having a large area can be produced by sputtering method using a powder material (as a target).

A perovskite type oxide according to the present invention represented by $ABO_3$ has a single crystal structure or a uniaxial-oriented crystal structure. In the $ABO_3$, site A includes Pb as a main component and site B consists of a plurality of elements. The perovskite type oxide has a plurality of crystal phases. The crystal phase mentioned herein refers to a crystal formed of a repeat of a unit phase of a crystal system selected from the group consisting of tetragonal, rhombohedral, orthorhombic, cubic, pseudo-cubic and monoclinic systems. Furthermore, the plurality of crystal phases has a single crystal structure or a uniaxial-oriented crystal structure in which these crystal phases are oriented in a single direction of a crystal axis <100> and integrated from each other. In other words, in the perovskite type oxide, not less than two types of crystal phases selected from the aforementioned crystal phases are oriented in a single crystal-axis direction and integrated into one to form a single crystal structure or a uniaxial-oriented crystal structure. The crystal structure of the present invention differs from a polycrystalline structure where a plurality of crystal phases different in crystal axis direction are contained via a grain boundary interposed between them. In the crystal structure of the present invention, a plurality of crystal phases are present in a single grain of the perovskite type oxide, and the grains are integrated into one, forming a single crystal. The domain of a single crystal is microscopically small. In other words, individual crystal phases constituting a single crystal are microscopically small. These crystal phases are uniformly present in a single crystal structure to form a single crystal structure or a uniaxial-oriented crystal structure. By virtue of this, the perovskite type oxide of the present invention can be suitably used as a material for a very minute element, such as MEMS, required for having uniform perovskite characteristics.

As the single crystal axis direction of a single crystal structure of the perovskite type oxide, direction <100> may be mentioned. The direction <100> is a general term representing, in total, 6 directions, including directions generally represented by [100], [010], [001] and the like. In the case of a cubic system, the crystal phase oriented in the direction of [100] is identical to that oriented in the direction of [001]. On the other hand, in the cases of tetragonal, rhombohedral, orthorhombic, pseudo-cubic and monoclinic systems, the crystal phase oriented in the direction of [100] is not identical with that oriented in the direction of [001]. However, in the perovskite type oxides of the present invention, even if they are tetragonal, rhombohedral, orthorhombic, pseudo-cubic and monoclinic systems, they have lattice constants close to that of a cubic system. The orientations of a tetragonal system in the crystal axis directions [100] and correspond to those of a cubic system in the crystal axis directions [100] and [001], respectively. The orientations of the rhombohedral system in the crystal axis directions [111] and [−1−1−1] correspond to those of the cubic system in the crystal axis directions [100] and [111], respectively. Therefore, these directions are collectively referred to as <100> and <111>. These crystal phases are present such that their crystal axis directions are oriented in the film-thickness direction.

In this embodiment, a perovskite type oxide has a single crystal structure or a uniaxial-oriented crystal structure having a plurality of crystal phases and oriented in the direction <100>, as described above. By virtue of this, a perovskite type oxide may be microscopically uniform and have good film characteristics. In addition, it is considered that phase transfer is likely to occur.

It can be confirmed by X-ray diffraction that the film of a perovskite type oxide is unidirectionally oriented. When a piezoelectric film of a PZT perovskite type structure is analyzed by X-ray diffraction (2θ/θ), peaks only derived from (L00) plane where L=1, 2, 3 . . . n (n is an integer), such as {100} and {200} are detected.

In the perovskite type oxide, a plurality of crystal phases may be present in any ratio. It is preferable that the ratio occupied by a tetragonal crystal in the entire crystal is 5 to 90%, and preferably 10 to 80% at the peak (intensity) of each of the crystal phases analyzed by the X-ray diffraction. The piezoelectric characteristic can be further improved.

Specific Examples of Perovskite Type Oxides

Specific examples of the perovskite type oxide represented by $ABO_3$ will be mentioned below.

[1] A PZNT (Pb—Zn—Nb—Ti) based perovskite type oxide represented by $ABO_3$ where site A includes Pb as a main component and site B includes Nb, Zn and Ti, and having a plurality of crystal phases.

[1-1] As the PZNT based perovskite type oxide, mention may preferably made of a perovskite type oxide represented by $(Pb_k, \alpha_l)_x (Zn_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.2 < m < 0.4$, $0.5 < n < 0.7$, $0.05 < o < 0.2$, $0 \leq p < 0.3$; α includes an element selected from the group consisting of La, Ca, Ba, Sr, Bi and Sb; and β includes an element selected from the group consisting of Pb, Sc, In, Yb, Ni, Ta, Co, W, Fe, Sn and Mg.

[2] A PZNT based perovskite type oxide represented by $ABO_3$ where site A include Pb as a main component and site B include at least three elements selected from the group consisting of Mg, Nb, Sc, In, Yb, Ni, Ta and Ti, and having a plurality of crystal phases.

[2-1] As the PZNT based perovskite type oxide, mention may preferably made of a perovskite type oxide represented by $(Pb_k,\alpha_l)_x(Mg_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.1 < m < 0.3$, $0.3 < n < 0.5$, $0.2 < o < 0.4$, $0 \leq p < 0.3$; $\alpha$ includes an element selected from the group consisting of La, Ca, Ba, Sr, Bi and Sb; and $\beta$ includes an element selected from the group consisting of Pb, Sc, In, Yb, Ni, Ta, Co, W, Fe and Sn.

[2-2] As the PZNT based perovskite type oxide, mention may preferably made of a perovskite type oxide represented by $(Pb_k,\alpha_l)_x(Ni_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.1 < m < 0.3$, $0.3 < n < 0.5$, $0.3 < o < 0.5$, $0 \leq p < 0.3$; $\alpha$ includes an element selected from the group consisting of La, Ca, Ba, Sr, Bi and Sb; and $\beta$ includes an element selected from the group consisting of Pb, Sc, In, Yb, Mg, Ta, Co, W, Fe and Sn.

[2-3] As the PZNT based perovskite type oxide, mention may preferably made of a perovskite type oxide represented by $(Pb_k,\alpha_l)_x(Sc_m, Ta_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.1 < m < 0.4$, $0.1 < n < 0.4$, $0.3 < o < 0.5$, $0 \leq p < 0.3$; $\alpha$ includes an element selected from the group consisting of La, Ca, Ba, Sr, Bi and Sb; and $\beta$ includes an element selected from the group consisting of Pb, Nb, In, Yb, Mg, Ni, Co, W, Fe and Sn.

[2-4] As the PZNT based perovskite type oxide, mention may preferably made of a perovskite type oxide represented by $(Pb_k,\alpha_l)_x(Sc_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.1 < m < 0.4$, $0.1 < n < 0.4$, $0.3 < o < 0.5$, $0 \leq p < 0.3$; $\alpha$ includes an element selected from the group consisting of La, Ca, Ba, Sr, Bi and Sb; and $\beta$ includes an element selected from the group consisting of Pb, Ta, In, Yb, Mg, Ni, Co, W, Fe and Sn.

[2-5] As the PZNT based perovskite type oxide, mention may preferably made of a perovskite type oxide represented by $(Pb_k,\alpha_l)_x(Yb_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.1 < m < 0.4$, $0.1 < n < 0.4$, $0.4 < o < 0.6$, $0 \leq p < 0.3$; $\alpha$ includes an element selected from the group consisting of La, Ca, Ba, Sr, Bi and Sb; and $\beta$ includes an element selected from the group consisting of Pb, Sc, In, Ta, Mg, Ni, Co, W, Fe and Sn.

[2-6] As the PZNT based perovskite type oxide, mention may preferably made of a perovskite type oxide, represented by $(Pb_k,\alpha_l)_x(In_m, Nb_n, Ti_o, \beta_p)_y O_3$ where $1 \leq x/y < 1.5$, $k+l=1$, $0.7 \leq k \leq 1$, $0 \leq l \leq 0.3$, $m+n+o+p=1$, $0.2 < m < 0.4$, $0.2 < n < 0.4$, $0.2 < o < 0.5$, $0 \leq p < 0.3$; $\alpha$ includes an element selected from the group consisting of La, Ca, Ba, Sr, Bi and Sb; and $\beta$ includes an element selected from the group consisting of Pb, Sc, Yb, Ta, Mg, Ni, Co, W, Fe and Sn.

Each of the perovskite type oxides represented by $ABO_3$ having the element compositions set forth in Sections [1] to [2] is located near the morphotropic phase boundary (generally referred to as "MPB"). Therefore, it is considered that a plurality of crystalline phases can be included in a single crystal structure or uniaxial-oriented crystal structure of the perovskite type oxide. As a result, the perovskite type oxide forms a uniform film having excellent piezoelectric characteristics and high relative dielectric constant.

Furthermore, an element Pb may be contained as the component of site A and site B. Bivalent Pb is contained as the component of site A, and quadrivalent Pb is contained as the component of site B.

A perovskite type oxide according to the present invention is preferably formed into a film. This is because the film-form perovskite type oxide has a high film-strength and adhesiveness. The thickness of the film is preferably 1 μm to 10 μm (both inclusive). This is because the film having a thickness within the aforementioned range is sufficient to be used in an MEMS actuator and can be manufactured by an epitaxial film-formation process.

Note that there is a material prepared by mixing a relaxer type $PbZnNbO_3$ material, which has an analogous element composition to that of the PZNT based perovskite oxide [1], with $PbTiO_3$. However, this material differs from a perovskite type oxide according to the present invention. This is because the relaxer type mixture has a polycrystalline state where a plurality of crystal phases different in crystal axis direction are present with the grain boundary interposed between them, whereas, the perovskite type oxide of the present invention has a mixture of crystal phases.

As a material having an analogous element composition to that of the multiple-component perovskite oxide [2] mentioned above and high piezoelectric characteristics, the following materials may be mentioned: a mixture of a relaxer type $PbMgNbO_3$ material and $PbTiO_3$; a mixture of a relaxer type $PbNiNbO_3$ material and $PbTiO_3$; a mixture of a relaxer type $PbScTaO_3$ material and $PbTiO_3$; a mixture of a relaxer type $PbScNbO_3$ material and $PbTiO_3$; a mixture of a relaxer type $PbYbNbO_3$ material and $PbTiO_3$; and a mixture of a relaxer type $PbInNbO_3$ material and $PbTiO_3$.

However, all of the relaxer type mixtures fail to correspond to a perovskite type oxide. This is because each of the relaxer type mixtures has a polycrystalline state where a plurality of crystal phases different in crystal axis direction are present with a grain boundary interposed between them, whereas, the perovskite type oxide of the present invention has a mixture of crystal phases. In addition, only a bulk type relaxer mixture is known. Therefore, when the relaxer mixture is used in an MEMS actuator, a thin film must be cleaved out from the bulk. Therefore, it is extremely difficult to make the thin film.

On the other hand, the material according to the embodiment of the present invention has a single crystal or a uniaxial-oriented crystal structure of <100> orientation having a plurality of crystal phases. Therefore, the material is microscopically uniform and can be formed into a film with good film characteristics, so that it can be suitably used in an MEMS actuator.

[Method of Producing a Perovskite Type Oxide]

A perovskite type oxide according to the present invention can be formed into a thin film, by a vacuum film-formation method, for example, sputtering while heating at high temperature, using a target containing elements in the same mixing ratio as in the thin film of a perovskite type oxide to be formed.

To describe more specifically, as a target for use in sputtering, a raw material mixture is prepared by adding powders of metal oxides so as to contain elements in the same ratio as in a desired perovskite type oxide represented by $ABO_3$ while sufficiently stirring.

For example, when the PZNT based perovskite type oxide disclosed in Section [1-1] above is formed on a substrate, a raw material mixture can be prepared by adding powders of $PbO_2$, ZnO, $Nb_2O_5$, $PbTiO_3$, $La_2O_3$ and SrO.

These raw material mixtures are uniformly charged in a stainless steel plate (for use in a sputtering target) without leaving a space and used as a sputtering target.

When sputtering is performed using the sputtering target while heating at a high temperature, a single crystal or single orientation crystal oxide film containing not less than two types of crystal phases selected from the group consisting of tetragonal, rhombohedral, orthorhombic, cubic, pseudo-cubic and monoclinic systems, on a single crystal substrate formed of, for example, $SiTiO_3$ (100). The sputtering is preferably performed while heating at a temperature as high as 500° C. to 700° C., and more preferably, 500° C. to 600° C. This is because Pb is likely to remove at a temperature of 600° C. or more.

Since it is difficult to form a ceramic material generally used as a sputtering target, from a PZNT based perovskite type oxide, it has been extremely difficult to form the PZNT based perovskite type oxide film by sputtering. However, in this embodiment, a sputtering target is prepared by adding powders. Therefore, even if a material cannot be formed into a ceramic material to be used as a sputtering target, a film of the material can be formed by sputtering in accordance with this embodiment. In this manner, the range where sputtering can be applied can be broadened. Furthermore, a sputtering target prepared from powder materials is better than a ceramic sputtering target since the former target is easier to prepare a raw material containing elements in the desired ratio for obtaining a desired material than the latter target.

Furthermore, a film of a multiple-system perovskite type oxide as described in Section [2-1] can be formed by preparing a raw material mixture from $PbO_2$, $MgO$, $Nb_2O_5$, $PbTiO_3$, $La_2O_3$ and $SrO$ in accordance with the aforementioned method.

[Piezoelectric Element]

A piezoelectric element according to the present invention is not particularly limited as long as it has a piezoelectric layer containing the perovskite type oxide of the present invention and a pair of electrodes in contact with the piezoelectric layer. When voltage is applied to the pair of electrodes, the piezoelectric layer of the piezoelectric element is displaced and returns to the original state by terminating the application of voltage.

An example of the piezoelectric element of the present invention is shown in FIG. 1. The piezoelectric element shown in FIG. 1 has a stacked structure formed by stacking a piezoelectric film 10, which has a piezoelectric member 17 sandwiched between a pair of electrodes (a lower electrode 16 and an upper electrode 18) on a substrate 20 with a vibration board 15 interposed between them. In this case, a buffer layer 19 for controlling a crystal structure may be placed between the vibration board 15 and the piezoelectric film 10.

As the material for the substrate to be used in a piezoelectric element according to the present invention, a material having good crystallinity, for example, Si, is preferable. More specifically, an SOI (silicon-on-insulator) substrate in which an $SiO_2$ film is formed on a Si substrate may be mentioned. The thickness of a substrate may be, for example, 100 to 1,000 μm.

The vibration board is provided for transmitting displacement of a piezoelectric member. The vibration board is preferably highly lattice matched with a substrate and has sufficiently high Young's modulus for functioning as a vibration board. When a substrate is formed of silicon oxide, for example, stabilized zirconium is preferably used as the material for a vibration board. When an SOI substrate is used, the $SiO_2$ layer formed on a Si single crystal layer may be used as the vibration board. As the thickness of the vibration board, 0.5 to 10 μm, and preferably 1.0 to 6.0 μm, may be mentioned. When a piezoelectric member has a buffer layer, the thickness of the buffer layer is included in the thickness of the vibration board.

The buffer layer is provided to play a role in matching the crystal lattice constant of the substrate with that of the piezoelectric member. If the substrate is satisfactorily lattice matched with the piezoelectric member, the buffer layer may not be used. A buffer layer playing the aforementioned role may be formed of a stacked structure of a plurality of layers. The material for the buffer layer is preferably one well lattice-matched even with the underlying vibration board in direct contact with it. When the substrate is formed of silicon, stabilized zirconia $YSZ(Y_2O_3—ZrO_2)$ and $CeO_2$ may be mentioned as a material for the buffer layer.

The lower electrode may be formed directly on the buffer layer 19 or between the vibration board 15 and the buffer layer 19. When the buffer layer is not provided, the lower electrode may also serve as the buffer layer. In this case, the lower electrode may take a multi-layered structure having an adhesion layer, which improves the adhesiveness to the vibration board. As a material for the lower electrode, a metal material or an oxide material may be used. As the metal material, Au, Pt, Ni, Cr and Ir may be mentioned. On these metal materials, Ti, Ta and Pb may be stacked. As the oxide material, $SrTiO_3$, $SrRuO_3$, $IrO_2$, $BaPbO_3$, $RuO_2$, $Pb_2Ir_2O_7$ and the like doped with La and Nb may be mentioned. One of the pair of electrodes preferably has a crystal structure. As a material of the adhesion layer, mention may be made of metals such as Ti, Cr and Ir, and oxides of these metals such as $TiO_2$ and $IrO_2$.

Such a lower electrode 44 influences the crystal orientation of the piezoelectric member that is provided on it. Therefore, the preferential crystal orientation of the lower electrode facing the substrate is preferably <100>. When the preferential crystal orientation of the lower electrode facing the substrate surface is <100>, the preferential crystal orientation of the piezoelectric member 45 to be stacked thereon comes to be <100>.

A thin film of a metal or an oxide conductive material constituting the lower electrode preferably has a degree of crystal orientation of 70% or more. The degree of crystal orientation refers to the degree of orientation of a crystal film measured by X-ray diffraction (XRD) (measured at a peak intensity, X-ray incident angle of θ to 2θ). If the degree of crystal orientation of a metal electrode thin film is 70% or more, the lower electrode has good electric properties. As a result, the crystallinity of the piezoelectric member that is formed on the lower electrode becomes satisfactory. The degree of crystal orientation of the thin film formed of a metal or oxide conductive material constituting the lower electrode is preferably 85% or more.

The film thickness of the lower electrode is preferably 50 to 400 nm, and more preferably, 80 to 200 nm.

The piezoelectric member to be used in a piezoelectric element according to the present invention is exemplified above. The film thickness of the piezoelectric member is preferably 100 nm to 10 μm (both inclusive), and more preferably, 500 nm to 8 μm (both inclusive). If the film thickness of a piezoelectric member is 100 nm or more, an inkjet head M employing such a piezoelectric element is durable against the stress produced by reciprocal movement. On the other hand, if the film thickness of the piezoelectric member is 10 μm or less, peel-off of the film can be prevented.

The upper electrode 18 is arranged directly on the piezoelectric member 17 and charges the piezoelectric member in concert with the lower electrode. The upper electrode may be provided on the piezoelectric member via an adhesion layer, which is formed of the same material as in the adhesion layer to be provided between the lower electrode and the vibration board. The upper electrode and the lower electrode may be the same or different in material and constitution. In a liquid discharge head, one of the electrodes may be used as a common electrode and the other as a driving electrode.

[A Method of Producing a Piezoelectric Element]

A preferable method of producing a piezoelectric element includes a step of forming a piezoelectric layer on one of the electrodes by a method of producing a perovskite type oxide and a step of forming the other electrode on the piezoelectric layer.

An electrode may be formed by a thin film formation technique such as a sputtering method, CVD method, laser abrasion method and MBE method. By virtue of these methods, an electrode can be formed of a material having a specific crystal structure and oriented in a specific direction.

[Liquid Discharge Head]

A liquid discharge head according to the present invention has discharge ports, separate liquid chambers communicating with the discharge ports, piezoelectric elements provided corresponding to the liquid chambers, and vibration boards each provided between a liquid chamber and a piezoelectric element. The piezoelectric element used herein is exemplified above. Since the liquid discharge head of the present invention has the piezoelectric element mentioned above, a liquid discharge apparatus using the liquid discharge head exhibits excellent liquid discharge characteristics.

Figure 2:
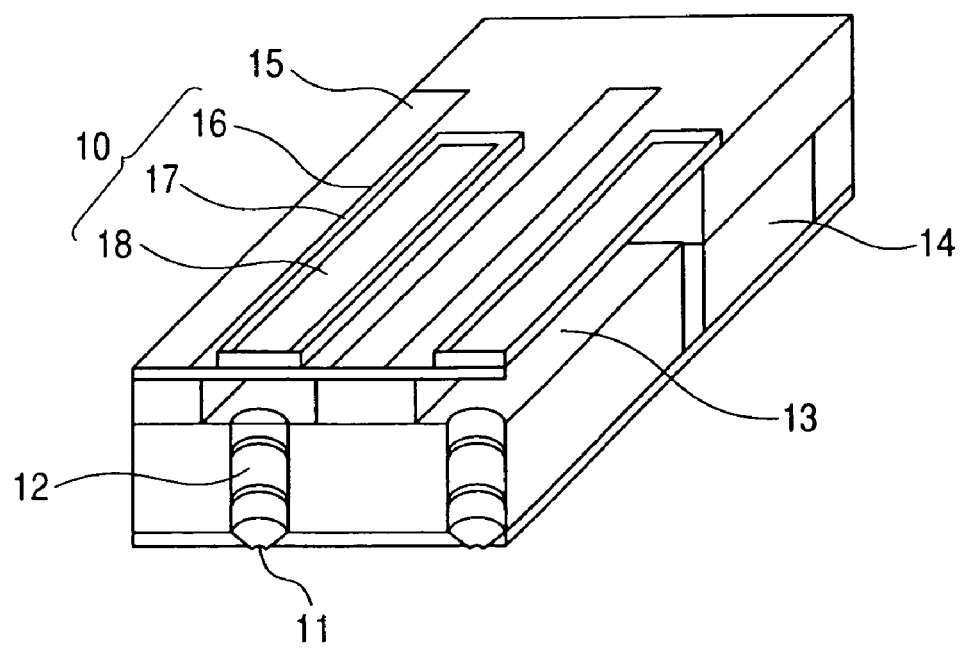
FIG. 2 is a schematic view of a gist portion of a liquid discharge head applicable to the present invention.

As a liquid discharge head according to the present invention, an inkjet head may be mentioned. The inkjet head, as shown in FIG. 2, has a plurality of separate liquid chambers 13, which is connected to a common liquid chamber 14 storing ink, and discharge ports 11 for discharging ink through respective communicating holes 12 from the separate liquid chambers 13. The ceiling of each of the separate liquid chambers 13 is formed of a vibration board 15. On the vibration board 15, a piezoelectric element 10 having a piezoelectric member 17 sandwiched between a pair of electrodes (a lower electrode 16 and an upper electrode 18) is formed directly or with a buffer layer interposed between them.

As the piezoelectric element 10, the aforementioned piezoelectric element of the present invention, for example, shown in FIG. 1 is used. As a material for the vibration board 15 of the piezoelectric element, use is preferably made of an oxide such as $ZrO_2$, $BaTiO_3$, $MgO$, $SrTiO_3$, $MgAl_2O_4$ doped with a rare earth element such as Sc and Y and/or Si. The Si may be doped with a dopant such as boron (B). The vibration board 15 containing any one of these materials as a main component has a specific crystal structure, more specifically, a crystal structure <100>, <110> or <111> having an orientation degree of preferably 80% or more, and more preferably, 99% to 100%. The term "99% orientation" means that less than 1% of crystals are oriented in a different direction from a main orientation direction as measured by XRD.

As a material for the buffer layer 19, mention may be preferably made of a material having a lattice constant different by 8% or less from that of the substrate. Furthermore, the buffer layer 19 may be preferably formed of an oxide, which can be formed into a film by a sputtering method, MO-CVD method or laser abrasion method. More specifically, an oxide preferably has a crystal structure of a cubic system or pseudo-cubic system and having a lattice constant of 3.6 to 6.0 angstroms.

Specific compositions of the oxide include 10% $Y_2O_3$—$ZrO_2$ (100)/Si (100), 10% $Y_2O_3$—$ZrO_2$(111)/Si(111), $SrTiO_3$(100)/MgO(100), $MgAl_2O_4$(100)/MgO(100) and $BaTiO_3$(100)/MgO(100). The lattice constant of 10% $Y_2O_3$—$ZrO_2$ is 5.16 angstroms, the lattice constant of $SrTiO_3$: 3.91 angstroms, the lattice constant of MgO: 4.21 angstroms, and the lattice constant of $MgAl_2O_4$: 4.04 angstroms, the lattice constant of $BaTiO_3$: 3.99 angstroms, and the lattice constant of Si: 5.43 angstroms. When the matching of the lattice constants is calculated by taking 10% $Y_2O_3$—$ZrO_2$(111)/Si(111) as an example, the following values are obtained. In the case of 10% $Y_2O_3$—$ZrO_2$(111)/Si(111), $5.16 \times \sqrt{2} = 7.30$ angstroms. In the case of Si(111), $5.43 \times \sqrt{2} = 7.68$ angstroms. The difference in lattice matching between them is 4.9%, which is a satisfactory level.

As materials for the upper electrode and the lower electrode, the same materials as used in the electrode of the piezoelectric element mentioned above may be mentioned. In particular, as a material for the lower electrode 16 provided on the buffer layer 19, the following materials may be mentioned. When the buffer layer is formed of 10% $Y_2O_3$—$ZrO_2$ (111), films of Pt (100), Ir (100), $SrRuO_3$ (100), $Sr_{0.96}La_{0.04}TiO_3$ (100), $Sr_{0.97}Nb_{0.03}TiO_3$ (100) and $BaPbO_3$ (100) may be mentioned as the lower electrode 16. When the buffer layer is formed of $SrTiO_3$ (100), films of Pt (100), Ir (100), $SrRuO_3$ (100), $Sr_{0.97}La_{0.03}TiO_3$ (100), $Sr_{0.97}Nb_{0.03}TiO_3$ (100) and $BaPbO_3$ (100) may be mentioned. When the buffer layer is formed of $BaTiO_3$ (001) or $MgAl_2O_4$ (100), a film of (100) may be mentioned.

Furthermore, when the lower electrode 16 is provided directly on the vibration board 15 without providing the buffer layer 19, the lower electrode 16 may be made of $SrRuO_3$ (100)/$SrTiO_3$ (100), Pt (100)/MgO (100), Ir (100)/MgO (100), or Ru (100)/MgO (100).

The upper electrode and the lower electrode may take any shape. The lower electrode may be larger than the piezoelectric member and extended to the position at which no piezoelectric member is provided. The upper electrode may be extended in the opposite direction to the extension direction of the lower electrode and connected to a driving power source (not shown).

As the piezoelectric member, that used in the piezoelectric element above may be mentioned. Although the piezoelectric member shown in the figure has a rectangular upper surface, the upper surface may take any shape such as an ellipse, circle and parallelogram. The sectional shape of the piezoelectric member may take any shape such as rectangular, trapezoidal, and inverted trapezoidal.

Figure 3:
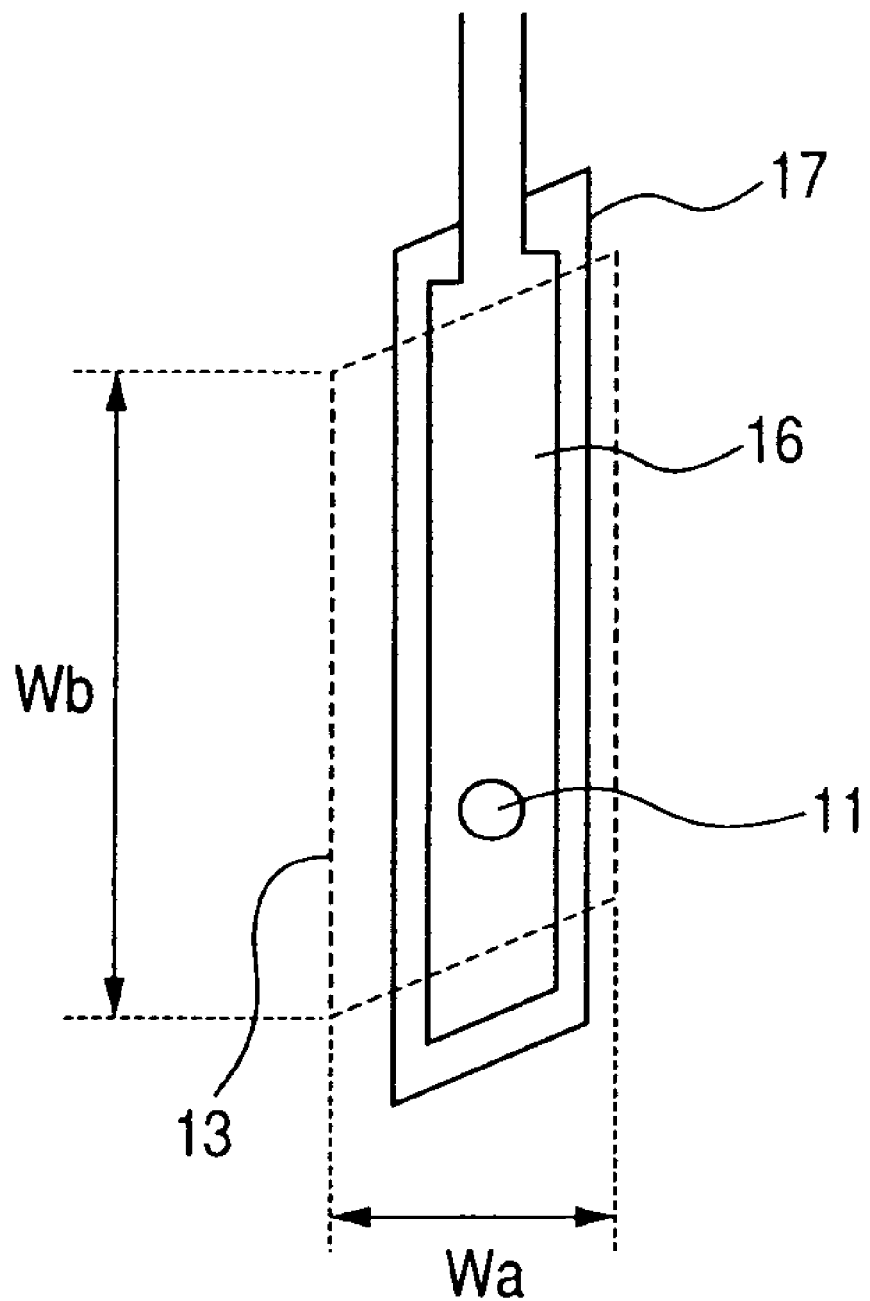
FIG. 3 is a plan view showing a part of a liquid discharge head applicable to the present invention.

The width Wa of the separate liquid chamber 13 of the inkjet head, as shown in a schematic view of FIG. 3 showing the structure of a single inkjet unit, is preferably 30 to 180 μm. The length Wb of the separate liquid chamber 13 is preferably 0.3 to 6.0 mm, which varies depending upon the amount of liquid drops to be discharged. The shape of the discharge port 11 may be circular or star, and the diameter thereof is preferably 7 to 30 μm. Alternatively, the discharge port 11 may be connected to a communication hole 12 larger in diameter with a tapered portion between them. The length of the communication hole 12 is preferably 0.05 to 0.5 mm. When the length of the communication hole 12 is within the range, liquid droplets can be discharged in constant amounts while maintaining a constant speed.

The liquid discharge head of the present invention discharges liquid from the discharge ports of the separate liquid chambers by use of a volume change of the chamber generated by the vibration board when the displacement of the piezoelectric member is transmitted to the vibration board. Since the piezoelectric member has excellent piezoelectric characteristics, liquid can be discharged from a liquid discharge head uniformly at a high speed. Therefore, separate liquid chambers can be arranged with a high density, with the result that the liquid discharge head can be reduced in size.

The liquid discharge head of the present invention can be applied not only to an inkjet head but also liquid discharge portions of various apparatuses for discharging liquid.

[Method of Manufacturing a Liquid Discharge Head]

A method of manufacturing a liquid discharge head according to the present invention has steps of forming a vibration board on a substrate, forming a lower electrode on the vibration board, forming a piezoelectric layer on the lower electrode by the aforementioned method of manufacturing a perovskite type oxide, and forming an upper electrode on the piezoelectric layer.

(Formation of a Vibration Board)

As a method of forming a vibration board 15 on a substrate 20, use may be made of a thin film formation method such as a sputtering method, CVD method, laser ablation method and MBE method. Of them, the sputtering method is particularly preferable. This is because an oxide thin film can be epitaxially grown on the substrate 20 by sufficiently heating it during a heating step.

After or before forming the buffer layer 19, the lower electrode layer 16, piezoelectric layer 17 and upper electrode 18 on a substrate of Si and $SiO_2$, the substrate may be as a thin film and used as the vibration board 15. In particular, when a material of the substrate is SOI, an insulating $SiO_2$ layer and an Si single crystal layer formed thereon may be used as the vibration board 15.

(Formation of a Buffer Layer)

Subsequently, the buffer layer 19 is formed on the vibration layer 15 for controlling the crystal orientation of the upper electrode in a desirably direction. As a method of forming the buffer layer 19, use may be made of a thin film formation method such as a sputtering method, CVD method, laser ablation method and MBE method. When the buffer layer is formed by such a thin film formation method, the material of the buffer layer formed on the vibration layer 15 can be oriented in a specific direction. In forming the buffer layer film by the aforementioned thin film formation method, the substrate is preferably heated to 500° C. to 850° C. during the film formation. When the vibration layer 15, itself, also serves as the buffer layer 19 between the substrate 20 and the lower layer electrode 16, a buffer layer may not be additionally formed.

(Method of Forming an Electrode)

As a method of forming the lower electrode 16 on the vibration board 15 (or on the buffer layer 19 when the buffer layer 19 is formed), use may be made of a thin film formation method such as a sputtering method, CVD method, laser ablation method and MBE method. Of them, the sputtering method is particularly preferable. This is because an oxide thin film can be epitaxially grown on the buffer layer 19 or the substrate 20 by sufficiently heating it, for example, to 500° C. to 700° C. during a heating step.

The lower electrode 16 may have a pattern shown in FIG. 3 and arranged at the position shown in the figure relative to the piezoelectric member 17.

The upper electrode may be formed on the piezoelectric member 17 in the same manner as in the lower electrode.

(Method of Forming Separate Liquid Chambers)

A method of forming separate liquid chambers of a liquid discharge head according to the present invention will be explained below. The separate liquid chambers 13 may be formed on the substrate 20 having a piezoelectric element formed thereon by the aforementioned method. Alternatively, the separate liquid chambers 13 may be formed on a different substrate and then bonded to the substrate having a piezoelectric element formed thereon.

Figure 4:
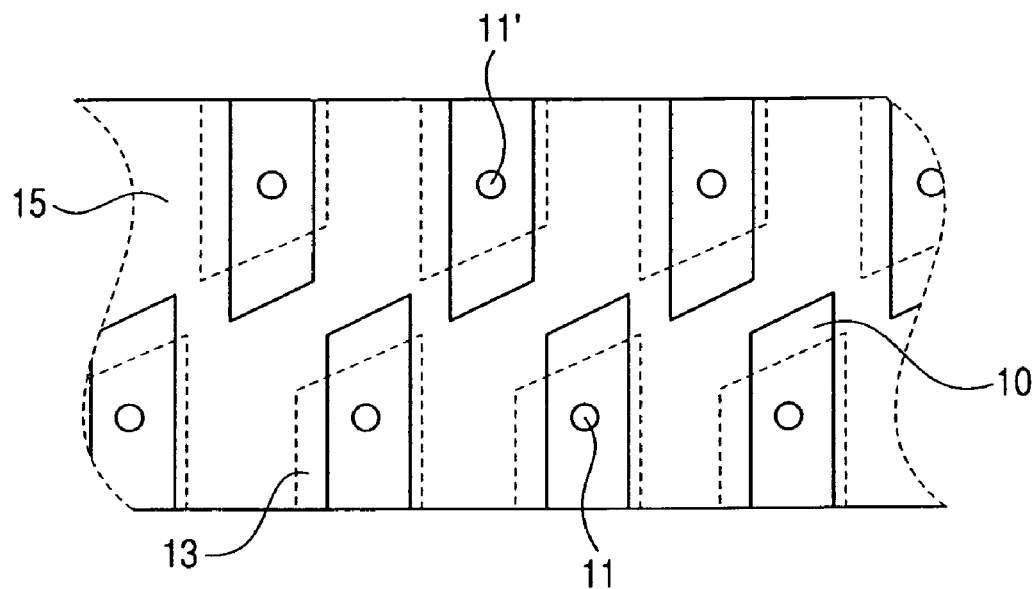
FIG. 4 is a plan view showing a part of a liquid discharge head applicable to the present invention.
Figure 5:
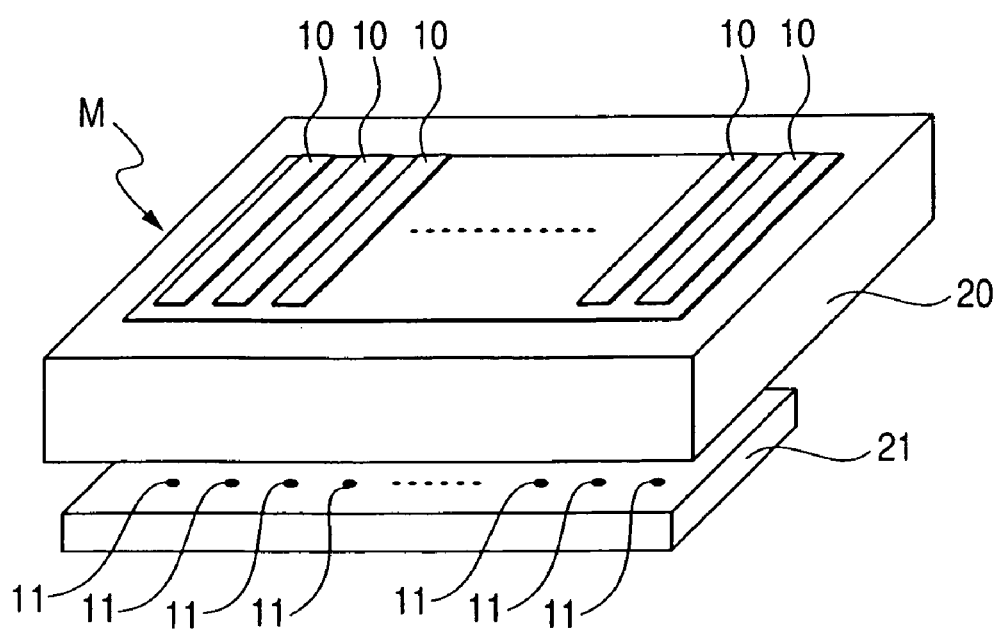
FIG. 5 is an external view perspectively showing a liquid discharge head applicable to the present invention.

Separate liquid chambers are formed by forming a depressed portion by wet etching, dry etching or sand mill, in a part of the substrate 20 having a piezoelectric element is formed thereon. For example, as shown in the bottom view of a liquid discharge head (FIG. 4), a plurality of depressed portions (shown by a broken line), which are to serve as separate liquid chambers 13, are formed at regular pitches (intervals) and in a staggered arrangement while keeping a positional relationship with the piezoelectric elements 10 as shown in the figure. Thereafter, a nozzle plate 21 having discharge ports 11, which correspond to the depressed portions formed in the substrate 20, are formed, as shown in FIG. 5. Alternatively, a nozzle plate having discharge ports 11 and communication holes may be connected. It is preferable that the separate liquid chambers 13 and the piezoelectric elements 10 are preferably arranged as shown in the figure, since pressure can be appropriately applied to the separate liquid chambers 13 by the displacement of the piezoelectric members. In forming a depressed portion in a substrate, a silicon substrate having (110) orientation may be anisotropically etched with an alkaline liquid in accordance with wet-etching method to form the depressed portion having a parallelogram upper surface. When the separate liquid chambers formed in a staggered arrangement have a parallelogram upper surface, discharge ports (11 and 11') of the separate liquid chambers can be arranged in reduced intervals and, further in the case, if the upper surfaces of piezoelectric members are parallelogram, the separate liquid chambers can be arranged with a high density.

A discharge port for ink and further a communication hole can be formed in the nozzle plate 21 by a perforation method using etching, mechanical processing and laser light irradiation. A material for the nozzle plate in which the discharge ports 11 are to be formed, may be the same or different as that of the substrate 20 on which piezoelectric elements are to be formed. In this case, it is preferable to use a material, for example, SUS and Ni, which differs in thermal expansion coefficient by $1 \times 10^{-6}$ to $1 \times 10^{-8}$ ° C. from the substrate 20 having piezoelectric elements formed thereon, as the material for the nozzle plate.

The substrate 20 and the nozzle plate 21 may be bonded with an organic adhesive agent; however, they are preferably bonded with an inorganic metal material. As an inorganic metal material for use in bonding, a material capable of bonding them at a temperature as low as 250° C. or less. This is because even if the length of the nozzle plate is long, the metal material has a small difference in thermal expansion coefficient with the substrate, with the result that warpage of the element can be avoided. Furthermore, it is possible to suppress the piezoelectric element from being damaged. Specific examples of the metal material for use in bonding may include In, Au, Cu, Ni, Pb, Ti and Cr.

[Liquid Discharge Apparatus]

Figure 6:
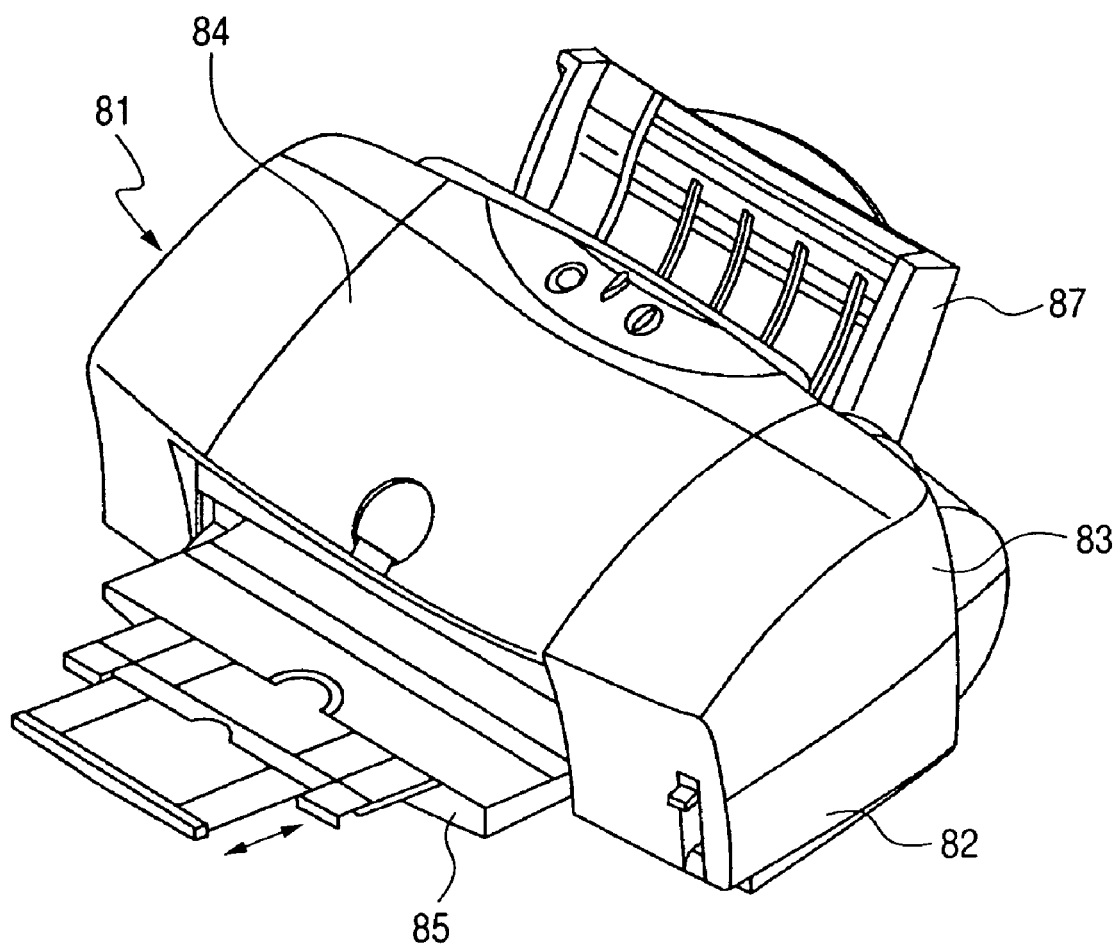
FIG. 6 is an external view schematically showing a liquid discharge apparatus applicable to the present invention.
Figure 7:
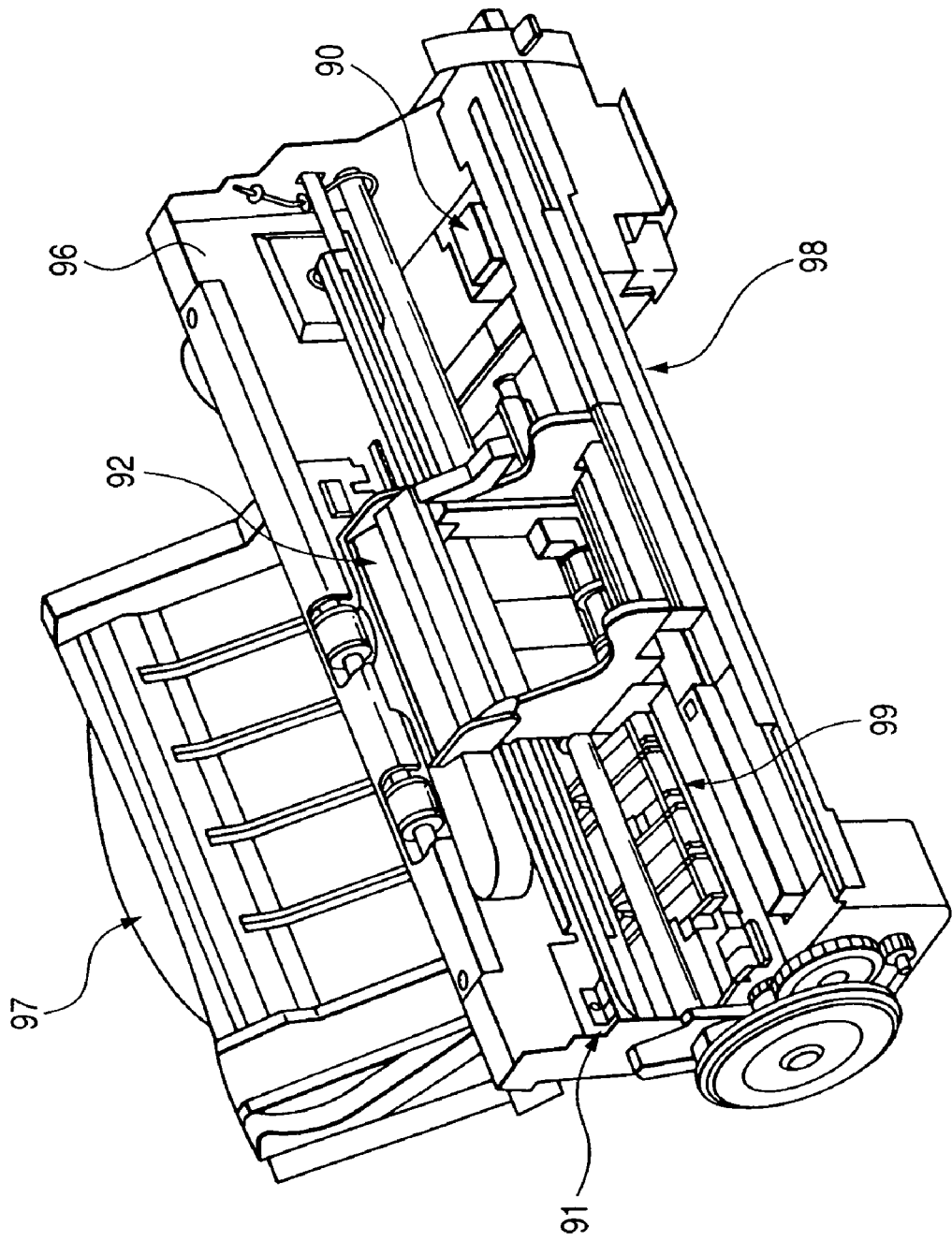
FIG. 7 is a view schematically showing an inner operational mechanism of a liquid discharge apparatus applicable to the present invention.

A liquid discharge apparatus according to the present invention is not particularly limited as long as it has the liquid discharge head. As an example, an inkjet recording apparatus may be mentioned. FIG. 6 shows an inkjet recording apparatus 81. When outer jacket portions 82 to 85 and 87 are removed from the inkjet recording apparatus 81, an operation mechanism shown in FIG. 7 is obtained. As shown in FIG. 7, the inkjet recording apparatus has an automatic feeder section 97 for automatically feeding a recording paper sheet (recording medium) into an apparatus main body 96, and a transfer section 99 for guiding the recording paper sheet fed from the automatic feeder section 97 to a predetermined recording position and transferring the sheet from the recording position to a discharge port 98. The inkjet recording apparatus further has a recording section 91 at which recording is made on the recording paper sheet transferred to the recording position and a recover section 90 for applying a recover treatment to the recording section 91. The recording section 91 houses a liquid discharge head according to the present invention and has a carriage 92 for moving reciprocally on a rail.

The operation of the inkjet recording apparatus will be explained. When an electric signal is sent from a computer separately arranged and connected to the apparatus, the carriage 92 moves on the rail and discharges liquid. More specifically, when a driving voltage is applied to the electrodes sandwiching an piezoelectric member to cause displacement of the piezoelectric member, which pressurizes each of separate liquid chambers via the vibration board 15, thereby discharging liquid (ink) from the discharge port 11. In this way, desired letters can be printed.

According to a liquid discharge apparatus according to the present invention, liquid droplets can be discharged uniformly at a high speed and the apparatus can be reduced in size.

In the aforementioned example, a case where the liquid discharge apparatus is applied to a printer is shown; however, the apparatus can be used in inkjet recording apparatuses of a facsimile, composite machine, and copier and the like; and industrial discharge apparatuses.

EXAMPLES

How to manufacture a liquid discharge head according to the present invention will be explained more specifically by way of Examples.

Example 1

First, as a substrate (substrate 20) of the main body, an Si substrate of (100) orientation was used. On the Si substrate, a stabilized zirconia YSZ ($Y_2O_3$—$ZrO_2$) film serving as the vibration board 15 and the buffer layer 19 were formed so as to have (100) orientation by a sputtering apparatus (L-210-FH, manufactured by ANELVA). The vibration board 15 and the buffer layer 19 were epitaxially grown by supplying a power of 60 W between the Si substrate and the target in a chamber containing Ar and $O_2$ gas as ion formation gases and set at an inner pressure of 1.0 Pa while heating the Si substrate at 800° C. As a result, single orientation (100) films of the vibration board 15 and the buffer layer 19 of 200 nm thick were obtained.

Next, a Pt lower electrode 16 was formed on the vibration board 15 in the same manner as in a formation method of the vibration board 15. More specifically, the lower electrode was epitaxially grown by supplying a power of 100 W between the vibration board and the target (Pt) in a chamber containing Ar as an ion formation gas and set at an inner pressure of 0.5 Pa while heating the substrate at 600° C. As a result, a single orientation (100) Pt film of 400 nm thick was epitaxially grown.

A piezoelectric member 17 was formed on the lower electrode by the sputtering apparatus mentioned above. More specifically, a method of forming a piezoelectric member 17 include steps of preparing powder by adding oxides such as PbO, ZnO, $Nb_2O_5$ and $PbTiO_3$ so as to satisfy the following target composition formula, placing the powder in a pot mill, placing about 50 magnet balls of 15 mm diameter in the pot mill, and rotating the pot mill at a rotation speed of 300 rpm, thereby pulverizing and mixing the powder. Furthermore, the powder thus pulverized and mixed was placed together with glass beads of 1 mm diameter and a suspension solution in the container of a paint shaker and sufficiently dispersed by rotating the pain shaker at 640 rpm. Thereafter, glass, beads were removed and the dispersion solution was removed by an evaporator to prepare a powder material for a sputtering target.

<Target Composition 1>

$(Pb_k, \alpha_l)_x(Zn_m, Nb_n, Ti_o, \beta_p)_y O_3$ where $1 \leq x/y < 1.2$, $k+l=1$, $k=1$, $l=0$, $m+n+o+p=1$, $m=0.22$, $n=0.44$, $o=0.33$, $p=0$.

The sputtering-target powder material thus prepared was charged uniformly in a stainless plate for a sputtering target without leaving space to prepare a sputtering target. Sputtering was performed while heating at a high temperature, in the same manner as in the formation of the vibration board and electrodes, by supplying a power of 100 W between the vibration board and the target (Pt) in a chamber containing Ar and $O_2$ as an ion formation gas and set at an inner pressure of 0.3 Pa, while heating the substrate at 650° C.

The sputtering was performed for 420 minutes to obtain a single orientation (100) single crystal piezoelectric member having a phase mixture of a tetragonal system and a rhombohedral system with a thickness of 3000 nm. The crystal phase was confirmed by XRD and TEM.

The upper electrode 18 was formed in the same manner as in the lower electrode. More specifically, the upper electrode 18 was epitaxially grown by supplying a power of 100 W between the vibration board and the target (Pt) in a chamber containing Ar as an ion formation gas and set at an inner pressure of 0.5 Pa while heating the substrate at 600° C. As a result, a single orientation Pt film of 400 nm thick was epitaxially grown.

Subsequently, the center portion of the opposite surface of the Si substrate to the surface having the vibration board 15 provided thereon was etched away by dry etching using inductively coupled plasma (ICP) to form a depressed portion for separate liquid chambers 13. The temperature of the substrate was set at 20° C. and $SF_6$ and $C_4F_8$ were used as gases. Inducing electricity by a high frequency coil is 1800 W in terms of radio frequency (RF) and the inner pressure of the etching chamber was set at 4.0 Pa. A nozzle plate 21 formed of Si and having discharge ports 11 was adhered to the Si board by Si—Si bonding to prepare separate liquid chambers 13. In this manner, a liquid discharge head M in which piezoelectric elements 10 are aligned was formed. The length of the vibration portion of each of the piezoelectric elements 10 was 5,000 μm and the width thereof was 100 μm.

Example 2

The same procedure as in Example 1 was repeated to form a liquid discharge head except that the target composition for a piezoelectric member was prepared from PbO, MgO, $Nb_2O_5$ and $PbTiO_3$ in accordance with the following formula.

<Target Composition 2>

$(Pb_k, \alpha_l)_x(Mg_m, Nb_n, Ti_o, \beta_p)_y O_3$, where $1 \leq x/y < 1.2$, $k=1$, $l=0$, $m+n+o+p=1$, $m=0.22$, $n=0.44$, $o=0.33$, and $p=0$.

The piezoelectric member obtained in the aforementioned method has a uniaxial-oriented (100) single crystal formed of a phase mixture of a pseudo cubic system and a tetragonal system.

Example 3

The same procedure as in Example 1 was repeated to form a liquid discharge head except that the target composition for a piezoelectric member was prepared from PbO, NiO, $Nb_2O_5$ and $PbTiO_3$ in accordance with the following formula.

<Target Composition 3>

$(Pb_k, \beta_l)_x(Ni_m, Nb_n, Ti_o, \beta_p)_y O_3$, where $1 \leq x/y < 1.2$, $k=1$, $l=0$, $m+n+o+p=1$, $m=0.20$, $n=0.40$, $o=0.40$, and $p=0$.

The piezoelectric member obtained in the aforementioned method has a uniaxial-oriented (100) single crystal formed of a phase mixture of a pseudo cubic system and a tetragonal system.

Example 4

The same procedure as in Example 1 was repeated to form a liquid discharge head except that the target composition for a piezoelectric member was prepared from PbO, $Sc_2O_3$, $Ta_2O_5$ and $PbTiO_3$ in accordance with the following formula.
<Target Composition 4>
$(Pb_k, \alpha_l)_x(Sc_m, Ta_n, Ti_o, \beta_p)_yO_3$, where $1 \leq x/y < 1.2$, k=1, l=0, m+n+o+p=1, m=0.275, n=0.275, o=0.45, and p=0.

The piezoelectric member obtained in the aforementioned method has a uniaxial-oriented (100) single crystal formed of a phase mixture of a pseudo cubic system and a tetragonal system.

Example 5

The same procedure as in Example 1 was repeated to form a liquid discharge head except that the target composition for a piezoelectric member was prepared from PbO, $Sc_2O_3$, $Nb_2O_5$ and $PbTiO_3$ in accordance with the following formula.
<Target Composition 5>
$(Pb_k, \alpha_l)_x(Sc_m, Nb_n, Ti_o, \beta_p)_yO_3$, where $1 \leq x/y < 1.2$, k=1, l=0, m+n+o+p=1, m=0.275, n=0.275, o=0.45, and p=0.

The piezoelectric member obtained in the aforementioned method has a uniaxial-oriented (100) single crystal formed of a phase mixture of a rhombohedral system and a tetragonal system.

Example 6

The same procedure as in Example 1 was repeated to form a liquid discharge head except that the target composition for a piezoelectric member was prepared from PbO, $Yb_2O_3$ $Nb_2O_5$ and $PbTiO_3$ in accordance with the following formula.
<Target Composition 6>
$(Pb_k, \alpha_l)_x(Yb_m, Nb_n, Ti_o, \beta_p)_yO_3$, where $1 \leq x/y < 1.2$, k=1, l=0, m+n+o+p=1, m=0.25, n=0.25, o=0.50, and p=0.

The piezoelectric member obtained in the aforementioned method has a uniaxial-oriented (100) single crystal formed of a phase mixture of a monoclinic system and tetragonal system.

Example 7

The same procedure as in Example 1 was repeated to form a liquid discharge head except that the target composition for a piezoelectric member was prepared from PbO, $In_2O_3$, $Nb_2O_5$ and $PbTiO_3$ in accordance with the following formula.
<Target Composition 7>
$(Pb_k, \alpha_l)_x(In_m, Nb_n, Ti_o, \beta_p)_yO_3$, where $1 \leq x/y < 1.2$, k=1, l=0, m+n+o+p=1, m=0.32, n=0.32, o=0.37, and p=0.

The piezoelectric member obtained in the aforementioned method has a uniaxial-oriented (100) single crystal formed of a phase mixture of pseudo cubic system and tetragonal system.

Comparative Example 1

The same procedure as in Example 1 was repeated to form a liquid discharge head except that the target composition for a piezoelectric member was prepared from PbO, MgO, $Nb_2O_5$ and $PbTiO_3$ in accordance with the following formula.
<Target Composition of Comparative Example 1>
$(Pb_k, \alpha_l)_x(Mg_m, Nb_n, Ti_o, \beta_p)_yO_3$ where $1 \leq x/y < 1.2$, k=1, l=0, m+n+o+p=1, m=0.20, n=0.40, o=0.10, and p=0.

The piezoelectric member obtained in the aforementioned method has a uniaxial-oriented (100) single crystal formed of a pseudo cubic system.

Comparative Example 2

The same procedure as in Example 1 was repeated to form a liquid discharge head except that the target composition for a piezoelectric member was prepared from PbO, $ZrO_3$, and $PbTiO_3$ in accordance with a target composition: $(Pb_{110})(Zr_{50}, Ti_{50})O_3$.

The piezoelectric member obtained in the aforementioned method has a single crystal formed of a cubic system.

Comparative Example 3

The same procedure as in Example 1 was repeated to form a liquid discharge head except that an amorphous film was formed on the lower electrode at room temperature using ceramic having a composition of $(Pb_{110})(Zr_{56}, Ti_{44})O_3$ as a target, followed by baking it at 700° C. for 5 hours in an oxygen atmosphere. The piezoelectric member obtained in the aforementioned method has a single crystal preferentially oriented in a <100> direction.

In Examples and Comparative Examples mentioned above, examples of a single crystal were shown. A piezoelectric film oriented in a single direction <100> can be obtained by changing the film formation conditions, more specifically, by forming a film underlying the piezoelectric film of, for example, stabilized zirconia YSZ having a single orientation.

[Structural Analysis]

How to confirm the state of a crystal phase, that is, how to perform structural analysis will be explained taking Example 2 as an example.

The crystal phase of a single crystal perovskite type oxide prepared in Example 2 was confirmed as follows.

Figure 8:
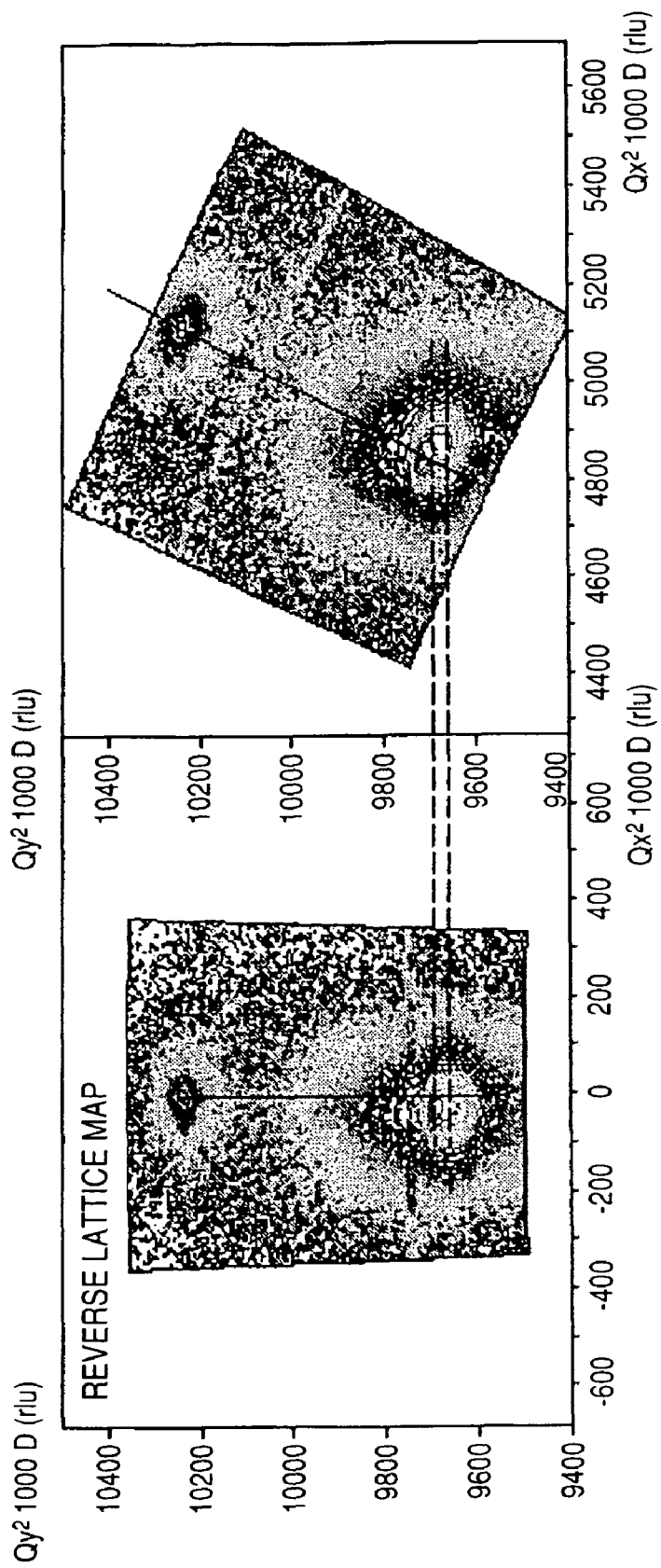
FIG. 8 is a reverse lattice spatial map (obtained by X-ray diffraction) of a perovskite type oxide prepared in Example 2.

The macroscopic state of the crystal was confirmed by X-ray diffraction, whereas the microscopic state thereof was confirmed by TEM. Reverse lattice spatial map of the single crystal perovskite type oxide prepared in Example 2 is shown in FIG. 8. A symmetric plane (200) is shown in the left side of FIG. 8, whereas an asymmetric plane (204) is shown in the right side thereof. In the map, there are two peaks, one is a peak showing that the lengths of the a and b axes are equal and the other is a peak showing that the lengths of the a and b axes are not equal. From this, it is demonstrated that there are two phases, a tetragonal system and a rhombohedral system.

In the same manner as mentioned above, it was confirmed that the piezoelectric element of Example 1 has a piezoelectric member having crystals of a tetragonal system and a rhombohedral system.

Figure 9:
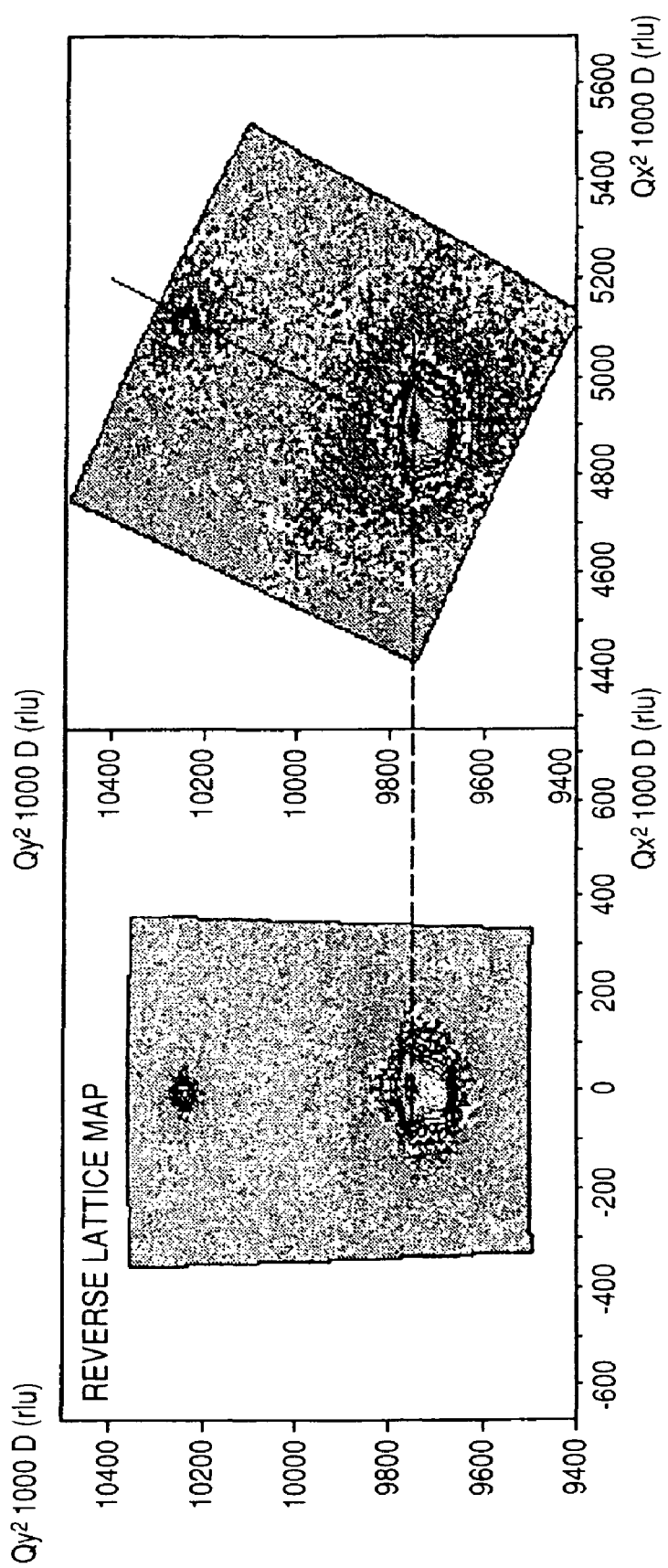
FIG. 9 is a reverse lattice spatial map (obtained by X-ray diffraction) of a perovskite type oxide prepared in Comparative Example 1.
Figure 10:
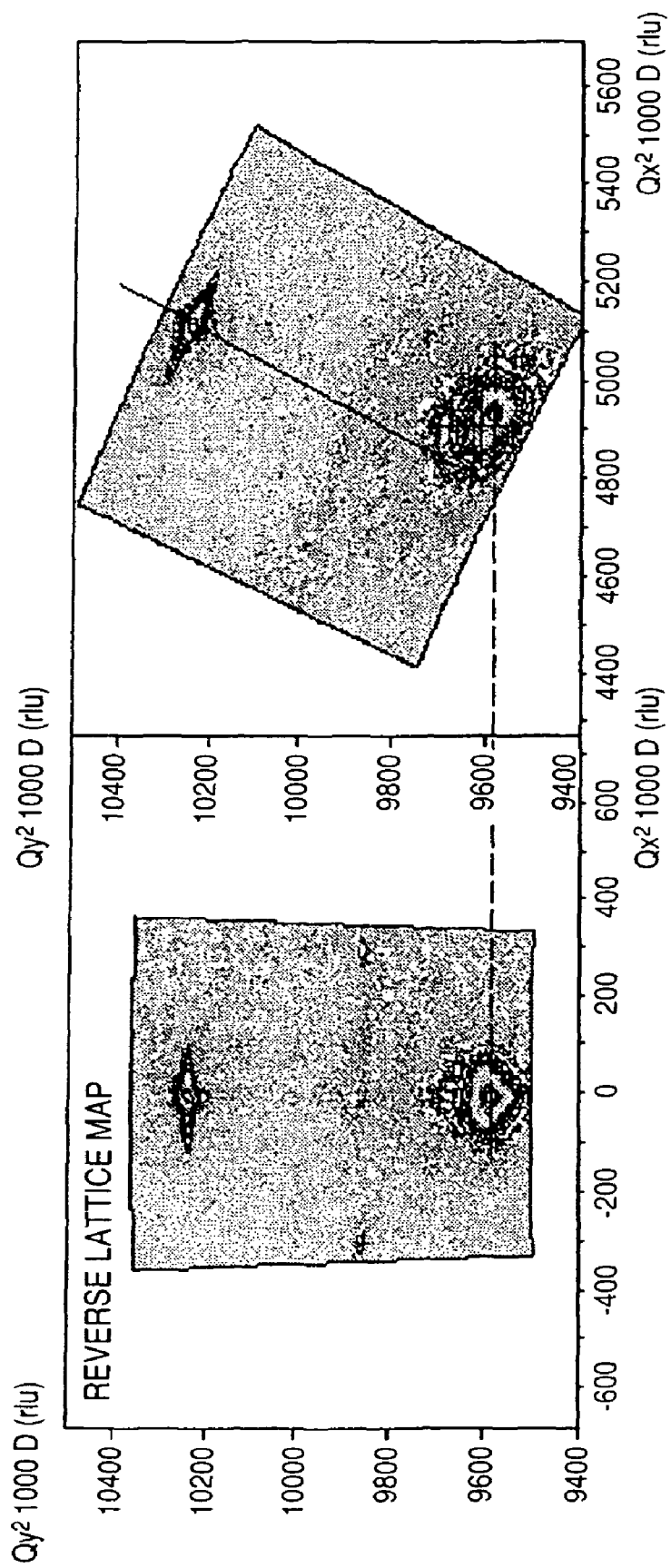
FIG. 10 is a reverse lattice spatial map (obtained by X-ray diffraction) of a perovskite type oxide prepared in Comparative Example 1.

In comparison with this, reverse lattice spatial maps of single crystal type oxides prepared in Comparative Examples 1 and 3 are shown FIGS. 9 and 10. In FIG. 9, a symmetric plane (200) is shown in the left side and an asymmetric plane (204) is shown in the right side. In the map, there is only one peak showing that the a and b axes are equal. From this, it is demonstrated that there is a single phase of a rhombohedral system. Furthermore, in Comparative Example 3 shown in FIG. 10, a symmetric plane (200) is shown in the left side and an asymmetric plane (204) is shown in the right side. Also, in this case, there is only a peak showing that the a and b axes are not equal. From this, it is demonstrated that there is a single phase of a tetragonal system. In the same manner, it was successfully demonstrated that the piezoelectric element according to Comparative Example 2 is formed of a single phase of PZT tetragonal system.

Figure 11:
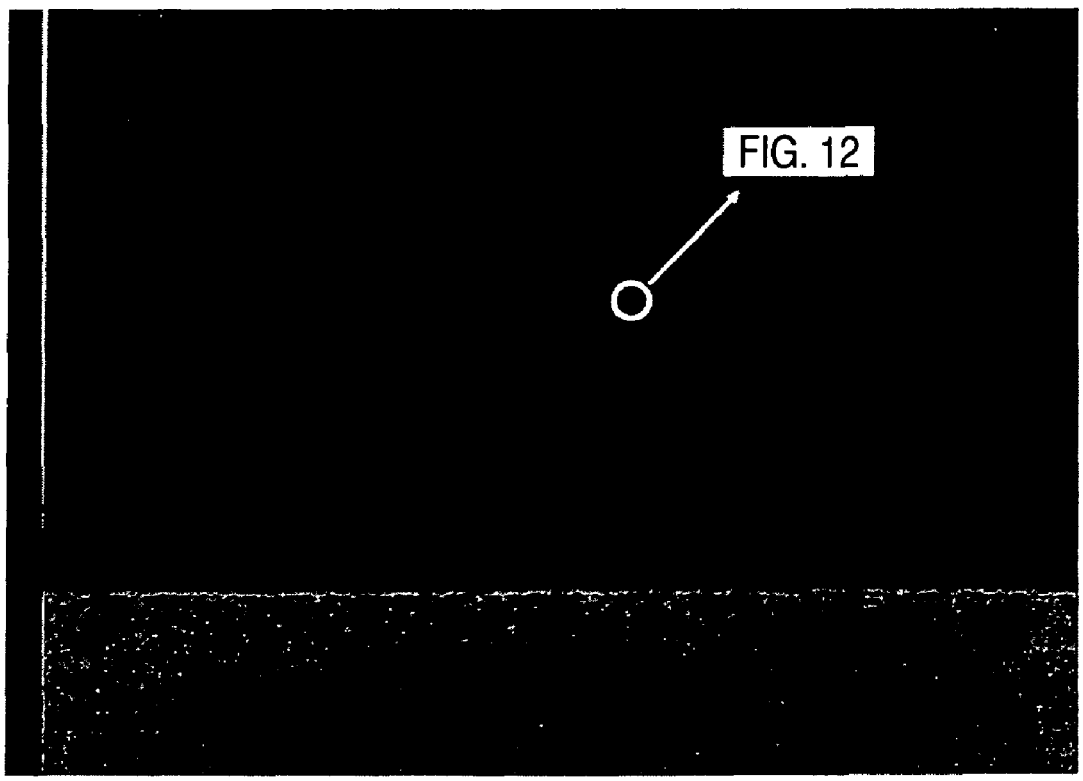
FIG. 11 is a view showing a transmission electromicroscopic (TEM) image of a perovskite type oxide prepared in Example 2.
Figure 12:
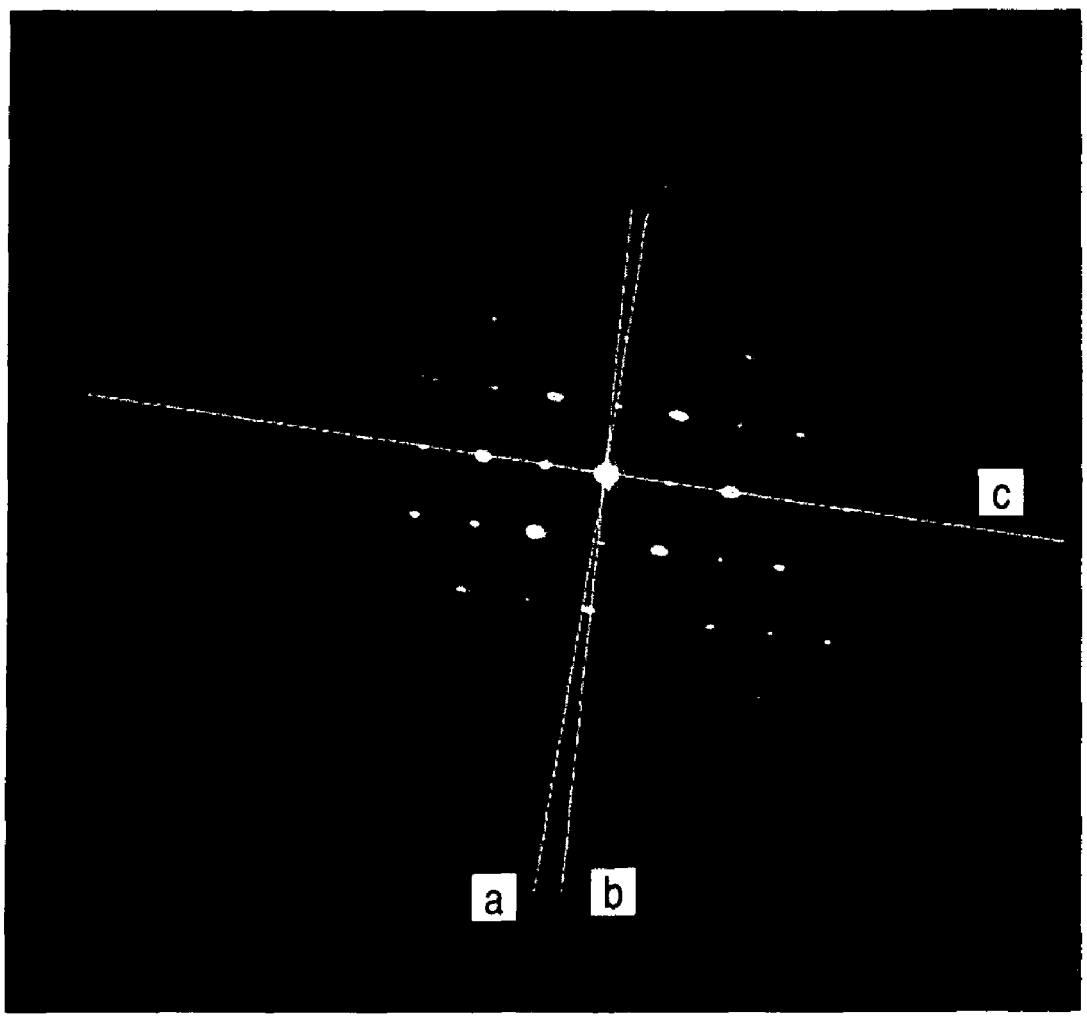
FIG. 12 is an electron-beam diffraction image of a small portion (exhibiting band contrast) of a transmission electromicroscopic (TEM) image of a perovskite type oxide prepared in Example 2.

The microscopic state was evaluated by TEM. A TEM image of a single crystal perovskite type oxide produced in Example 2 is shown in FIG. 11. As shown in FIG. 11, a band-like contrast crossed at about 45° with the interface of the substrate was observed. Then, a small portion within the band-like contrast was evaluated by electron beam diffraction. The results are shown in FIG. 12. As shown in FIG. 12, a single or a plurality of spots extending in the direction perpendicular to the crystal growing direction. From this, it is found that domains different in plane-interval are present. In other words, a plurality of crystal phases are present within an extremely small area having a beam spot diameter of 50 nm.

[Evaluation]

[Displacement Amount of Piezoelectric Member]

When a voltage of 20 V (10 kHz) was applied to the liquid discharge head obtained above, the displacement amount of the piezoelectric element was measured by a laser Doppler displacement measurer. The results are shown in Table 1.

TABLE 1

|  | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 |
| --- | --- | --- | --- | --- | --- | --- | --- | --- | --- | --- |
| Displacement amount (nm) | 1.60 | 1.50 | 1.45 | 1.40 | 1.20 | 1.37 | 1.60 | 0.60 | 0.40 | 0.30 |

From the results, it is demonstrated that the displacement amounts of the piezoelectric elements according to Examples 1 to 7 are significantly large compared to those of Comparative Examples 1 to 3.

[Accuracy of Liquid Droplets Ejected by the Liquid Discharge Head onto a Target]

Liquid droplets of ink having a viscosity of 10 cps were ejected by applying a voltage of 20 V (10 kHz). The misdirection of liquid droplets hitting on a recording medium was evaluated based on the data measured by an displacement accuracy measuring instrument. Evaluation was performed by measuring a specific pattern 5 times. Based on the worst value (3σ) of each of the measurement points, the deviation of a droplet from a target position (deviation of a droplet in the X direction (μm), deviation of a droplet in the Y direction (μm)) was obtained. The case where deviation from a target position is less than 0.1 μm is indicated by A. The case where deviation is within the range of not less than 0.1 μm to less than 0.2 μm is indicated by B. The case where deviation is within the rang of not less than 0.2 μm to less than 0.3 μm is indicated by C. The case where deviation is 0.3 μm or more is indicated by x. The results are shown in Table 2.

TABLE 2

|  | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 |
| --- | --- | --- | --- | --- | --- | --- | --- | --- | --- | --- |
| Accuracy of droplet hitting position | A | A | A | A | A | A | A | B | C | C |

From the results, droplets ejected by the liquid discharge head of Examples reached target points with an accuracy of less than 0.1 μm. In contrast, droplets ejected by Comparative Example 1 reached target points with an accuracy of not less than 0.1 μm to less than 0.2 μm. In Comparative Examples 2 and 3, the accuracy was not less than 0.2 μm to less than 0.3 μm. As is apparent from the results, it is demonstrated that the liquid discharge head of the present invention is highly stable and reliable.

As is shown in Embodiments mentioned above, it is possible to obtain a piezoelectric element having excellent and stable piezoelectric characteristics, having strength even if it is a thin film, high adhesiveness, and excellent durability, and to obtain a perovskite type oxide to be used in a condenser stable in relative dielectric constant.

Since the piezoelectric element exhibits excellent piezoelectric characteristics even if it is a thin film, the piezoelectric characteristics can be obtained even if the element is reduced in size. Therefore, the piezoelectric elements can be arranged with a high density.

In addition, since a perovskite type oxide having a large area can be easily and inexpensively manufactured by an epitaxial film formation process, it can be used in an MEMS device.

Furthermore since a perovskite type oxide can be easily and manufactured by an epitaxial film formation technique and the thin film formed of the perovskite type oxide is excellent in strength and adhesiveness to an electrode component, a piezoelectric element employing the perovskite type oxide has stable piezoelectric characteristics and excellent durability. When such a piezoelectric element is employed in a liquid discharge head, the resultant head can eject droplets at small intervals. Moreover, since the piezoelectric element has good piezoelectric characteristic and durability, it is possible to obtain a good liquid discharge apparatus capable of stably ejecting droplets toward target positions with high accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open applications No. 2005-241385, filed Aug. 23, 2005, and No. 2005-241431 filed Aug. 23, 2005 which are hereby incorporated by reference herein in their entirety.

What is claimed is:

1. A perovskite type oxide represented by $ABO_3$,
   wherein site A includes Pb as a main component and site B includes a plurality of elements, and
   wherein the perovskite type oxide has a crystal structure that is one of
   (a) a crystal structure including a plurality of crystal phases selected from the group consisting of tetragonal, rhombohedral, orthorhombic, cubic, pseudo-cubic and monoclinic structures, the plurality of crystal phases being oriented in the <100>direction and having no crystal grain boundaries interposed between the plurality of crystal phases, and
   (b) a crystal structure having no crystal grain boundaries in a direction of the oriented axis and having crystal grains respectively including a plurality of crystal phases selected from the group consisting of tetragonal, rhombohedral, orthorhombic, cubic, pseudo-cubic and monoclinic structures, the plurality of crystal phases being oriented in the <100>direction, the crystal grains respectively having no grain boundaries interposed between the plurality of crystal phases.

2. The perovskite type oxide according to claim 1, wherein the site B includes at least three elements selected from the group consisting of Zn, Mg, Nb, Sc, In, Yb, Ni, Ta and Ti.

3. The perovskite type oxide according to claim 2 represented by $(Pb_k,\alpha_l)_x(Zn_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.2<m<0.4$, $0.5<n<0.7$, $0.05<o<0.2$, $0 \leq p<0.3$; α includes an element selected from the group consisting of La, Ca, Ba, Sr, Bi and Sb, and β includes an element selected from the group consisting of Pb, Sc, In, Yb, Ni, Ta, Co, W, Fe, Sn and Mg.

4. The perovskite type oxide according to claim 2 represented by $(Pb_k,\alpha_l)_x(Mg_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.1<m<0.3$, $0.3<n<0.5$, $0.2<o<0.4$, $0 \leq p<0.3$; α includes an element selected from the group consisting of La, Ca, Ba, Sr, Bi and Sb; and β includes an element selected from the group consisting of Pb, Sc, In, Yb, Ni, Ta, Co, W, Fe and Sn.

5. The perovskite type oxide according to claim 2 represented by $(Pb_k,\alpha_l)_x(Ni_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.1<m<0.3$, $0.3<n<0.5$, $0.3<o<0.5$, $0 \leq p<0.3$; α includes an element selected from the group consisting of La, Ca, Ba, Sr, Bi and Sb; and β includes an element selected from the group consisting of Pb, Sc, In, Yb, Mg, Ta, Co, W, Fe and Sn.

6. The perovskite type oxide according to claim 2 represented by $(Pb_k,\alpha_l)_x(Sc_m, Ta_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.1<m<0.4$, $0.1<n<0.4$, $0.3<o<0.5$, $0 \leq p<0.3$; α includes an element selected from the group consisting of La, Ca, Ba, Sr, Bi and Sb; and β includes an element selected from the group consisting of Pb, Nb, In, Yb, Mg, Ni, Co, W, Fe and Sn.

7. The perovskite type oxide according to claim 2 represented by $(Pb_k,\alpha_l)_x(Sc_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.1<m<0.4$, $0.1<n<0.4$, $0.3<o<0.5$, $0 \leq p<0.3$; α includes an element selected from the group consisting of La, Ca, Ba, Sr, Bi and Sb; and β includes an element selected from the group consisting of Pb, Ta, In, Yb, Mg, Ni, Co, W, Fe and Sn.

8. The perovskite type oxide according to claim 2 represented by $(Pb_k,\alpha_l)_x(Yb_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.1<m<0.4$, $0.1<n<0.4$, $0.4<o<0.6$, $0 \leq p<0.3$; α includes an element selected from the group consisting of La, Ca, Ba, Sr, Bi and Sb; and β includes an element selected from the group consisting of Pb, Sc, In, Ta, Mg, Ni, Co, W, Fe and Sn.

9. The perovskite type oxide according to claim 2 represented by $(Pb_k,\alpha_l)_x(In_m, Nb_n, Ti_o, \beta_p)_y O_3$, where $1 \leq x/y < 1.5$, $k+l=1$, $0.7 \leq k \leq 1$, $0 \leq l \leq 0.3$, $m+n+o+p=1$, $0.2<m<0.4$, $0.2<n<0.4$, $0.2<o<0.5$, $0 \leq p<0.3$; α includes an element selected from the group consisting of La, Ca, Ba, Sr, Bi and Sb; and β includes an element selected from the group consisting of Pb, Sc, Yb, Ta, Mg, Ni, Co, W, Fe and Sn.

10. The perovskite type oxide according to claim 1, wherein the perovskite type oxide is a film having a thickness of 1 μm to 10 μm (both inclusive).

11. A perovskite type epitaxial oxide represented by $ABO_3$, wherein site A includes Pb as a main component and site B includes a plurality of elements, and wherein the perovskite type epitaxial oxide has a crystal structure that is one of (a) a crystal structure including a plurality of crystal phases selected from the group consisting of tetragonal, rhombohedral, orthorhombic, cubic, pseudo-cubic and monoclinic structures, the plurality of crystal phases being oriented in the <100>direction and having no crystal grain boundaries interposed between the plurality of crystal phases, and (b) a crystal structure having no crystal grain boundaries in a direction of the oriented axis and having crystal grains respectively including a plurality of crystal phases selected from the group consisting of tetragonal, rhombohedral, orthorhombic, cubic, pseudo-cubic and monoclinic structures, the plurality of crystal phases being oriented in the <100>direction, the crystal grains respectively having no grain boundaries interposed between at the plurality of crystal phases.

* * * * *